US009362113B2

(12) United States Patent
Meitl et al.

(10) Patent No.: US 9,362,113 B2
(45) Date of Patent: Jun. 7, 2016

(54) ENGINEERED SUBSTRATES FOR SEMICONDUCTOR EPITAXY AND METHODS OF FABRICATING THE SAME

(71) Applicant: Semprius, Inc., Durham, NC (US)

(72) Inventors: Matthew Meitl, Durham, NC (US); Scott Burroughs, Raleigh, NC (US)

(73) Assignee: Semprius, Inc., Durham, NC (US)

( * ) Notice: Subject to any disclaimer, the term of this patent is extended or adjusted under 35 U.S.C. 154(b) by 57 days.

(21) Appl. No.: 14/211,371

(22) Filed: Mar. 14, 2014

(65) Prior Publication Data

US 2014/0264763 A1    Sep. 18, 2014

Related U.S. Application Data

(60) Provisional application No. 61/788,526, filed on Mar. 15, 2013.

(51) Int. Cl.
*H01L 21/8238*    (2006.01)
*H01L 21/76*    (2006.01)
*H01L 21/02*    (2006.01)

(52) U.S. Cl.
CPC .... *H01L 21/02521* (2013.01); *H01L 21/02645* (2013.01); *H01L 21/02647* (2013.01)

(58) Field of Classification Search
CPC ................... H01L 21/2018; H01L 21/823807; H01L 21/76297; H01L 21/761; H01L 21/823878
USPC .......... 438/222, 226, 413, 416; 257/353, 586, 257/618, 623
See application file for complete search history.

(56) References Cited

U.S. PATENT DOCUMENTS

| 8,114,754 | B2* | 2/2012 | Letertre | 438/406 |
| 2006/0043419 | A1* | 3/2006 | Tachibana et al. | 257/200 |
| 2007/0015153 | A1 | 1/2007 | Amontov et al. | |
| 2008/0157235 | A1* | 7/2008 | Rogers et al. | 257/415 |
| 2008/0213982 | A1* | 9/2008 | Park et al. | 438/480 |
| 2009/0278125 | A1 | 11/2009 | Duan et al. | |
| 2011/0049568 | A1* | 3/2011 | Lochtefeld et al. | 257/190 |
| 2011/0291247 | A1 | 12/2011 | Letertre et al. | |
| 2012/0100692 | A1 | 4/2012 | Letertre | |

OTHER PUBLICATIONS

Notification of Transmittal of the International Search Report and the Written Opinion of the International Searching Authority, or the Declaration, in corresponding PCT Application No. PCT/US2014/027536 mailed Aug. 26, 2014 (12 pages).

* cited by examiner

Primary Examiner — Hsien Ming Lee
(74) Attorney, Agent, or Firm — Myers Bigel & Sibley, PA

(57) ABSTRACT

In a method for fabricating an engineered substrate for semiconductor epitaxy, an array of seed structures is assembled on a surface of the substrate. The seed structures in the array have substantially similar directional orientations of their crystal lattices, and are spatially separated from each other. Semiconductor materials are selectively epitaxially grown on the seed structures, such that a rate of growth of the semiconductor materials on the seed structures is substantially higher than a rate of growth of the semiconductor materials on regions of the surface. The semiconductor materials assume a lattice constant and directional orientation of crystal lattice that are substantially similar or identical to those of the seed structures. Related devices and methods are also discussed.

20 Claims, 6 Drawing Sheets

ENGINEERED SUBSTRATES FOR SEMICONDUCTOR EPITAXY AND METHODS OF FABRICATING THE SAME

CLAIM OF PRIORITY

This application claims priority to U.S. provisional patent application No. 61/788,526 entitled "ENGINEERED SUBSTRATES FOR SEMICONDUCTOR EPITAXY" filed on Mar. 15, 2013, the disclosure of which is incorporated by reference herein in its entirety.

FIELD

The present invention relates to semiconductor device fabrication, and more particularly, to epitaxial growth of semiconductors.

BACKGROUND

Large substrates with electronically active components distributed over the extent of the substrate may be used in a variety of electronic systems, for example, in flat-panel solar cells. The electronically active components on flat-panel substrates are typically formed by sputtering a layer of inorganic semiconductor material or by spin-coating organic material over the entire substrate and processing the layer to form electronic components. However, such coatings typically have relatively poor electronic characteristics. Inorganic semiconductor materials can be processed to improve their electronic characteristics, for example amorphous silicon can be treated to form low-temperature or high-temperature polycrystalline silicon. In other process methods, microcrystalline semiconductor layers can be formed by used an underlying seeding layer. These methods typically improve the electron mobility of the semiconductor, but the performance of the resulting layer may still be worse than is often desirable. The substrate and layer of semiconductor material are typically photo-lithographically processed to define electronically active components, such as transistors.

The substrate materials can also be limited, for instance, by processing steps that may be necessary to process the semiconductor material and the photo-lithographic steps that may be used to pattern the active components. For example, plastic substrates have a relatively limited chemical and heat tolerance and do not typically survive photo-lithographic processing.

SUMMARY

According to some embodiments of the present invention, in a method for making an engineered substrate, a substrate (also referred to as a target substrate) is provided. An array of seed structures is assembled on a surface of the target substrate. The seed structures in the array may have a set lattice constant, substantially similar directional orientations of their crystal lattices, and may be spatially separated from each other. Semiconductor materials are epitaxially grown selectively on the seed structures, such that a rate of growth of the semiconductor materials on the seed structures is substantially higher than a rate of growth of the semiconductor materials on regions of the surface. The semiconductor materials assume a lattice constant and directional orientation of crystal lattice that are substantially similar or identical to those of the seed structures.

In some embodiments, the assembling of the array of seed structures on the surface may be performed by transfer printing using an elastomer stamp from a source substrate to the surface of the target substrate.

In some embodiments, nearest neighbor seed structures in the array may be separated by about 10 microns or less.

In some embodiments, the crystal lattices may be directionally aligned to each other by better than about 1 degree.

In some embodiments, epitaxially growing semiconductor materials selectively on said seed structures may occur both normal to the surface and laterally across the surface, such that the lateral separation between the semiconductor materials grown on nearest neighbor seed structures substantially reduces or vanishes.

In some embodiments, the target substrate may be silicon or an alloy of silicon.

In some embodiments, the target substrate may include aluminum or aluminum oxide.

In some embodiments, the target substrate may include silicon dioxide.

In some embodiments, the target substrate may include molybdenum.

In some embodiments, the target substrate may be monocrystalline.

In some embodiments, the target substrate may be polycrystalline.

In some embodiments, the target substrate may be amorphous.

In some embodiments, the target substrate may include a thin film deposited on at least a portion of the regions between the printable seed structures.

In some embodiments, the target substrate may be larger than the source substrate.

In some embodiments, the lattice constant of the seed structures may be different than the lattice constant of the source substrate.

In some embodiments, the seed structures may be III-V materials, including one or more of the following non-exhaustive list and their alloys: gallium arsenide, gallium phosphide, gallium nitride, gallium antimonide, aluminum arsenide, aluminum phosphide, aluminum nitride, aluminum antimonide, indium arsenide, indium antimonide, indium nitride, and indium phosphide.

In some embodiments, the seed structures may be Group IV materials and their alloys, including carbon, silicon, germanium, and tin.

In some embodiments, the seed structures may include II-VI materials, for example cadmium telluride or zinc selenide.

In some embodiments, the semiconductor materials epitaxially grown on the seed structures may be III-V materials In some embodiments, the semiconductor materials epitaxially grown on the seed structures may be Group IV materials.

In some embodiments, the semiconductor materials epitaxially grown on the seed structures may be II-VI materials.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

Aspects of the present disclosure are illustrated by way of example and are not limited by the accompanying figures with like references indicating like elements.

DETAILED DESCRIPTION

Some embodiments of the present invention provide engineered substrates for epitaxial growth of semiconductors that have one or more of the following properties: large area (e.g., greater than about 100 square centimeters ($cm^2$)), low cost (e.g., less than about \$5/$cm^2$), and/or mechanical robustness (e.g., equivalent to a silicon wafer or tougher). The engineered substrates allow for tunable lattice parameters and crystal structure for epitaxial growth without metamorphic buffers. Embodiments of the present invention and materials fabricated thereby may be used, for instance, in the field of solar photovoltaics.

Figure 1:
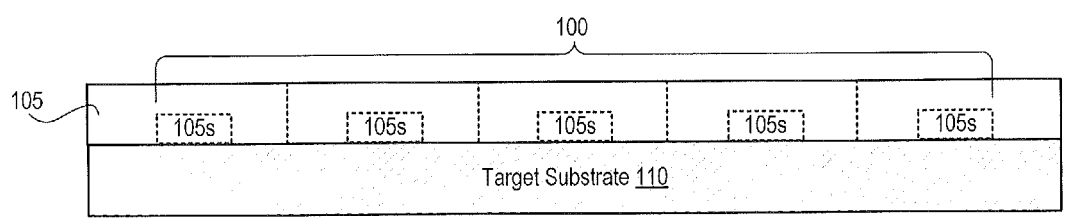
FIG. 1 illustrates a semiconductor layer formed on an engineered substrate according to some embodiments of the present invention

FIG. 1 illustrates an engineered substrate including a target substrate 110, seed structures 105s and semiconductor layers/materials 105 grown from the seed structures in accordance with some embodiments of the present invention. As shown in FIG. 1, the semiconductor layer 105 is a virtually single-crystal (i.e., substantially monocrystalline) continuous layer that is formed on a target substrate 110. The crystal lattices of the continuous layer 105 are substantially similar in orientation. For example, in some embodiments, the crystal lattices of the layer 105 may be directionally aligned relative to one another by better than about 1 degree.

Figure 6:
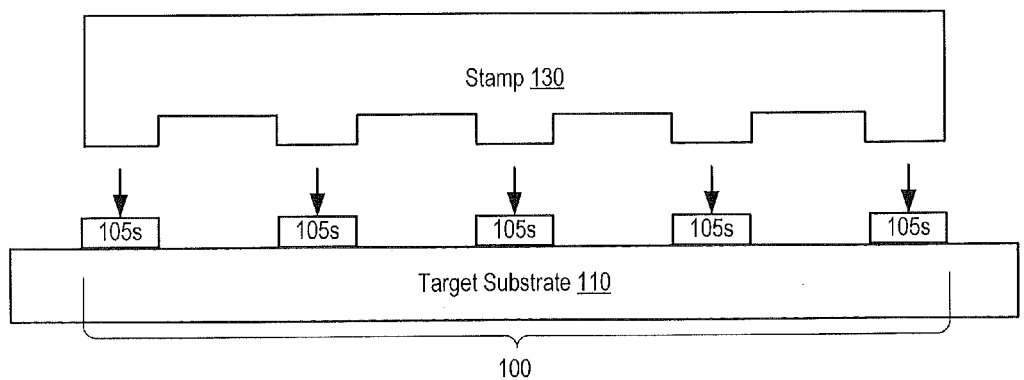

Prior to formation of the semiconductor layer 105, the target substrate 110 includes an array 100 of spatially separated seed structures 105s (shown by dotted lines in FIG. 1), providing an engineered substrate for epitaxial growth of the semiconductor layer 105. In particular, as shown in FIG. 1 and FIG. 6, the seed structures 105s define an array 100 where neighboring seed structures 105s are separated by about 10 microns or less. The seed structures 105s in the array 100 are assembled on the target substrate 110 to have substantially similar directional orientation of their crystal lattices, for example, by transfer printing in accordance with methods described in detail below. In some embodiments, the respective crystal lattices of the seed structures 105s may be directionally aligned to each other by better than about 1 degree. The semiconductor layer 105 is formed from the seed structures 105s by selective epitaxial growth as described in detail below, and thus, has a lattice constant and crystal lattice directional orientation that are substantially similar or identical to those of the respective seed structures 105s.

The target substrate 110 may differ from a source substrate used to form the seed structures 105s with respect to one or more characteristics. In some embodiments, the target substrate 110 may be selected based on a desired thermal conductivity, coefficient of thermal expansion, mechanical robustness, inexpensiveness, device functionality, surface characteristics, and/or area. For example, the target substrate 110 may provide a larger area than the source substrate 115 from which the seed structures 105s are grown for epitaxial growth of the semiconductor layer 105, as described below. The semiconductor layer 105 on the target substrate 110 may have a surface area of greater than about 100 $cm^2$ in some embodiments.

Figure 2:
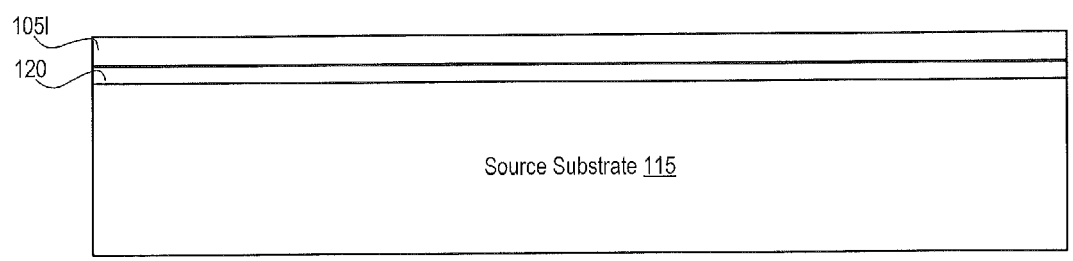
FIGS. 2-14 illustrate methods of fabricating engineered substrates for epitaxial growth of semiconductors according to some embodiments of the present invention.

FIGS. 2-14 illustrate methods of fabricating engineered substrates and epitaxial growth of semiconductor layers thereon according to some embodiments of the present invention. Referring now to FIG. 2, a release layer 120 and a single-crystal seed layer 105l are formed on a source substrate 115. For example, the release layer 120 and/or the single crystal seed layer 105l may be formed on the source substrate 115 by epitaxy. The single-crystal seed layer may be selected to have desired characteristics, for example, lattice constant and/or device functionality. The release layer 120 may be formed of a material having an etching selectivity with respect to that of the seed layer 105l.

Figure 3:
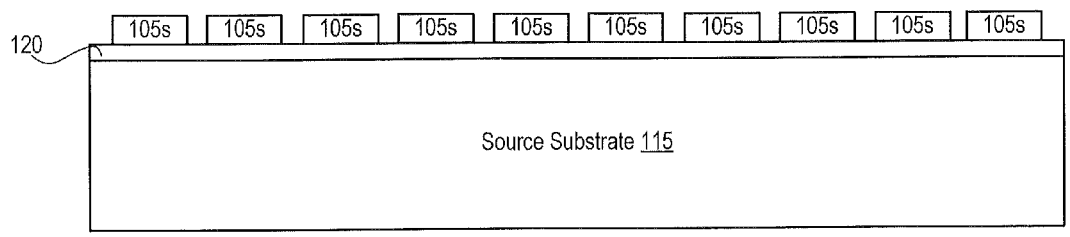

FIG. 3 illustrates formation of printable seed structures 105s on the source substrate 115. The seed structures 105s are formed in the single-crystal seed layer 105l. The seed structures 105s have substantially similar or identical directional orientations of their respective crystal lattices, as defined by the single-crystal seed layer 105l from which they were formed. However, the respective seed structures 105s may have a different lattice constant than the source substrate 115 in some embodiments. Anchoring and tethering structures are also formed to maintain the spatial positions and directional orientations of the seed structures 105s, for example, during the removal of the release layer 120 in subsequent processing.

Figure 4:
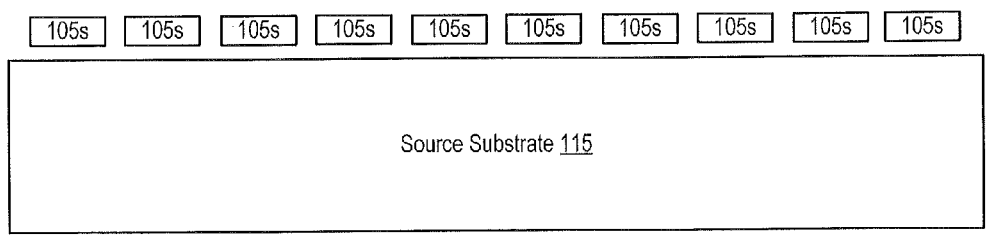
Figure 5:
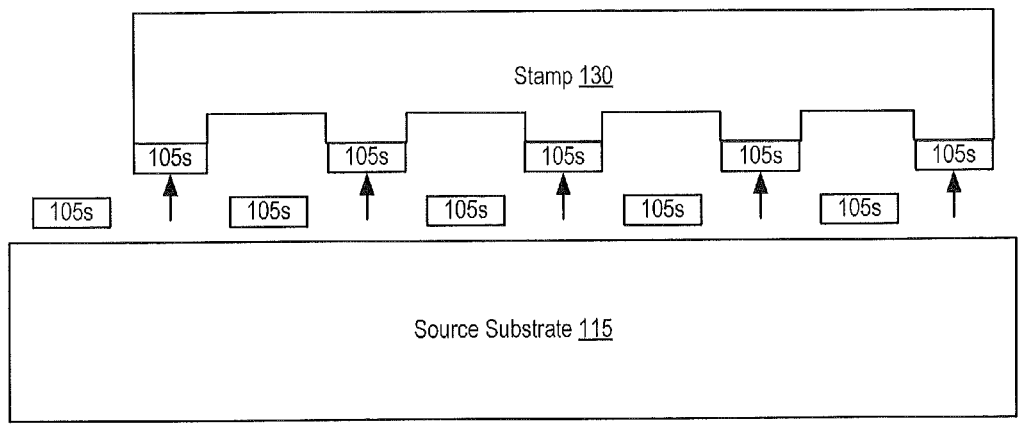

As shown in FIG. 4, the release layer 120 is selectively etched or otherwise removed to release the seed structures 105s from the source substrate. FIG. 5 illustrates the retrieval of a subset 100 of the printable seed structures 105s from the source substrate 115 using a stamp, such as an elastomer stamp 130. The retrieval process separates the subset 100 of the seed structures 105 from the source substrate, while maintaining the relative spatial positions and crystal lattice directional orientations between individual seed structures 105s in the subset 100.

Referring now to FIGS. 5 and 6, the subset 100 of the seed structures 105s is printed to a target substrate 110 using the elastomer stamp 130. The seed structures 105 may be printed to the target substrate 110 via direct bonding in some embodiments. The printing process defines an array 100 of seed structures 105s on the surface of the target substrate 110. Neighboring ones of the seed structures 105s of the array 100 are separated by about 10 micrometers or less in some embodiments.

The target substrate 110 may be selected to have one or more desired characteristics, for example, thermal conductivity, coefficient of thermal expansion, mechanical robustness, inexpensiveness, device functionality, surface characteristics, and/or large area. For example, in some embodiments, the target substrate 110 may be larger than the source substrate 115. The target substrate 110 may be monocrystalline, polycrystalline, or amorphous. In some embodiments, the target substrate 110 may include silicon or an alloy thereof, aluminum or aluminum oxide, silicon dioxide, or molybdenum. In some embodiments, after printing of the subset 100 to the target substrate 110, the operations of FIGS. 5 and 6 may be repeated, that is, the stamp 130 may be returned to the source substrate 115 to retrieve another subset of the seed structures, which may be printed to the target substrate 110.

Figure 7:
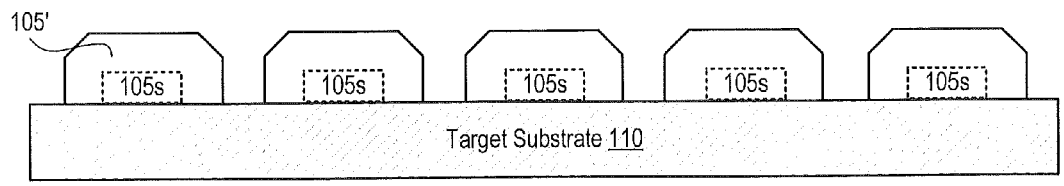

FIG. 7 illustrates selective epitaxial growth of respective semiconductor materials or layers 105' on the seed structures 105s. The rate of growth of the semiconductor materials 105' on the seed structures 105s may be substantially higher than the rate of growth of the semiconductor materials 105s on regions of the surface of the target substrate 110. For example, the epitaxial growth may occur slowly or not at all in regions of the surface of the target substrate 110 between nearest neighbor seed structures 105 due to a substantially decreased sticking coefficient of the grown semiconductor materials 105' on the surface of the target substrate 110 between the seed structures 105s. In some embodiments, the target substrate 110 may include a thin film on regions of the surface thereof between the seed structures 105s.

Still referring to FIG. 7, epitaxial growth of the semiconductor materials 105' progresses from the surfaces of the seed structures 105s in both a direction normal to the surface of the target substrate 110, as well as in a direction laterally across the surface of the target substrate 110. The grown semiconductor materials 105' assume lattice constants and directional orientations of their respective crystal lattices that are substantially similar or identical to those of the printed seed structures 105s.

In some embodiments, the seed structures 105s and the semiconductor materials 105' epitaxially grown thereon are III-V materials, including but not limited to one or more of the following and their alloys: gallium arsenide, gallium phosphide, gallium nitride, gallium antimonide, aluminum arsenide, aluminum phosphide, aluminum nitride, aluminum antimonide, indium arsenide, indium antimonide, indium nitride, and indium phosphide. In some embodiments, the seed structures 105s and the semiconductor materials 105' epitaxially grown thereon are Group IV materials and their alloys, including but not limited to carbon, silicon, germanium, and tin. In some embodiments, the seed structures 105s and the semiconductor materials 105' epitaxially grown thereon are II-VI materials, including but not limited to cadmium telluride or zinc selenide.

Figure 8:
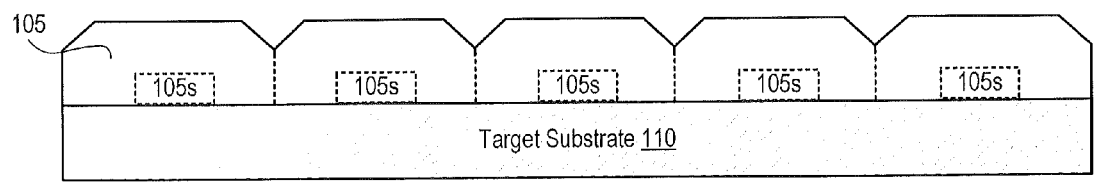
Figure 9:
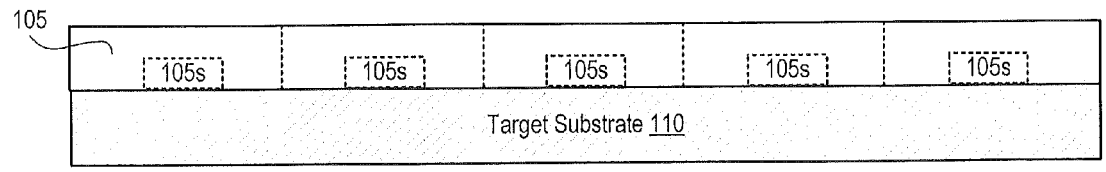

FIG. 8 illustrates the continued epitaxial growth of the respective semiconductor materials 105' such that the lateral separation between the semiconductor materials 105' grown on nearest neighboring seed structures 105s has substantially vanished, thereby forming a continuous, virtually single-crystal semiconductor layer 105 on the target substrate 110. As noted above, the target substrate 110 may be larger than the source substrate 115. The continuous layer 105 on the target substrate 110 may have a surface area of greater than about 100 cm² in some embodiments. As shown in FIG. 9, the surface of the grown continuous semiconductor layer 105 may (optionally) be polished.

Figure 10:
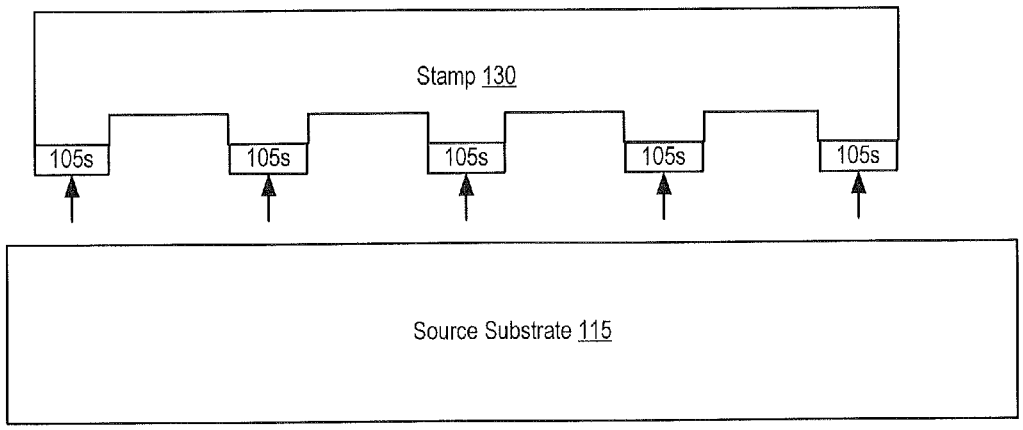
Figure 11:
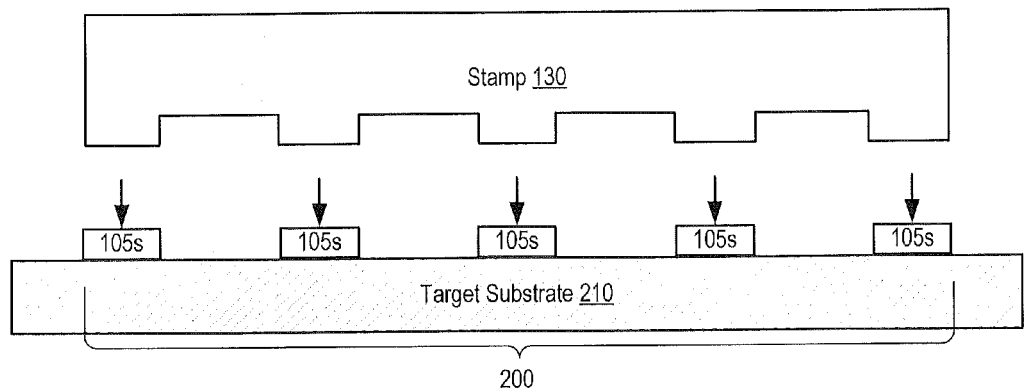

FIGS. 10-14 illustrate further operations for forming continuous, virtually single-crystal semiconductor layers on additional target substrates. Referring now to FIG. 10, the stamp 130 may return to the source substrate 115 to retrieve another subset 200 of seed structures 105s, for example, ones of the seed structures 105s remaining on the source substrate 115 after the operations of FIG. 5. As shown in FIG. 11, the subset 200 is printed onto a target substrate 210 using the elastomer stamp 130, defining an array 200 of seed structures 105s on the surface of the target substrate 210. Neighboring ones of the seed structures 105s of the array 200 may be separated by about 10 micrometers or less in some embodiments.

Figure 12:
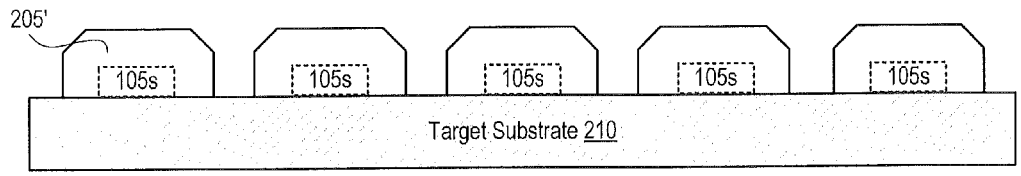

Referring now to FIG. 12, respective epitaxial semiconductor materials or layers 205' are selectively grown on the seed structures 105s. The semiconductor materials 205' are grown both in a direction normal to the surface of the target substrate 210, as well as in a direction laterally across the surface of the target substrate 210, where the grown semiconductor materials 205' assume lattice constants and directional orientations of their respective crystal lattices that are substantially similar or identical to those of the printed seed structures 105s.

Figure 13:
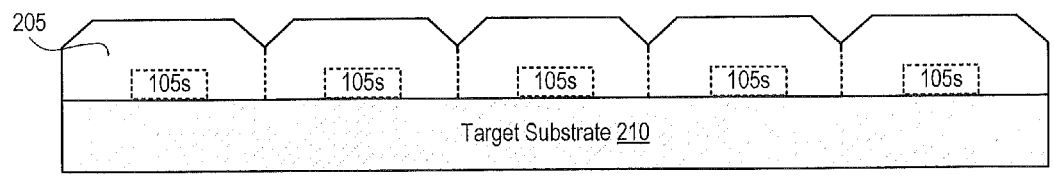
Figure 14:
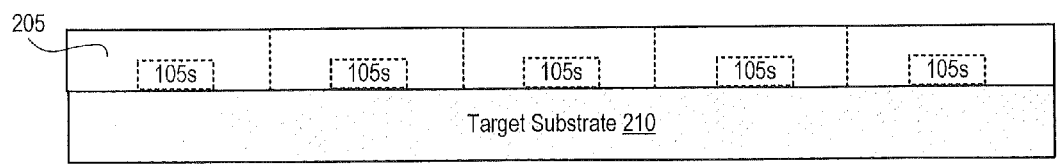

FIG. 13 illustrates the continued epitaxial growth of the respective semiconductor materials 205' such that the lateral separation between the semiconductor materials 205' grown on the nearest neighboring seed structures 105s has substantially vanished, thereby forming a continuous, virtually single-crystal semiconductor layer 205 on the target substrate 210. In FIG. 14, in the surface of the grown continuous semiconductor layer 205 may optionally be planarized.

The present invention has been described above with reference to the accompanying drawings, in which embodiments of the invention are shown. However, this invention should not be construed as limited to the embodiments set forth herein. Rather, these embodiments are provided so that this disclosure will be thorough and complete, and will Lilly convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. In no event, however, should "on" or "directly on" be construed as requiring a layer to cover an underlying layer.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an " and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Aspects of the present disclosure are described herein with reference to flowchart illustrations and/or block diagrams of methods and systems according to embodiments. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments of the present invention described herein, and of the manner and process of making and using them, and shall support claims to any such combination or subcombination.

Some embodiments of the present invention can provide continuous layers of epitaxial materials in an engineered substrate that have lattice constants that may be difficult or impossible to provide with conventional means. For example, thin InGaAs seed structures may be grown on a GaAs substrate, released and transferred to a sapphire substrate. The release and transfer process relaxes the built-in stress of the InGaAs seed structures caused by lattice mismatch with the GaAs substrate. The transferred InGaAs seeds on sapphire provide a substrate upon which high-quality, thick layers of epitaxial InGaAs layers may be grown. By contrast, growing high-quality, thick InGaAs of arbitrary composition on commercially available substrates may not be possible without the use of metamorphic growth techniques due to lattice mismatch. The engineered substrates of some embodiments of the present invention can thus provide advantageous combinations of properties of the non-native substrates and the seed structures. The engineered substrates of some embodiments of the present invention may also exhibit advantageous properties that are not available on either the non-native substrate or the seed structures, for example, thick high quality epitaxial materials with improved degrees of freedom in selecting a lattice constant.

In some embodiments, the semiconductor materials may be grown on the seed structures on the target substrate using molecular beam epitaxy, chemical beam epitaxy, metal-organic chemical vapor deposition, chemical vapor deposition, and/or liquid phase epitaxy. In some embodiments, the seed structures may include II-VI materials, for example, cadmium selenide.

Although the invention has been described herein with reference to various embodiments, it will be appreciated that further variations and modifications may be made within the scope and spirit of the principles of the invention, the scope of the present invention being set forth in the following claims.

The invention claimed is:

1. A method of fabricating a semiconductor device, the method comprising:
   assembling an array of discrete seed structures on a surface of a target substrate such that respective crystal lattices of the discrete seed structures of the array have substantially identical orientations by transferring the discrete seed structures from a source substrate to the surface of the target substrate; and
   selectively growing respective semiconductor layers on the discrete seed structures that collectively define a continuous layer having a surface area of at least 100 square centimeters ($cm^2$) on the surface of the target substrate,
   wherein the discrete seed structures of the array comprise ones of a plurality of discrete seed structures formed on the source substrate from a seed layer grown thereon.

2. The method of claim 1, wherein neighboring ones of the discrete seed structures on the surface of the target substrate are separated by a distance of about 10 micrometers or less, which is different than a distance separating neighboring ones of the plurality of discrete seed structures on the source substrate.

3. The method of claim 2, wherein the orientations of the respective crystal lattices are directionally aligned to each other by about 1 degree or less.

4. The method of claim 2, wherein the plurality of discrete seed structures on the source substrate include respective crystal lattices having the substantially identical orientations, and wherein transferring comprises:
   transferring a subset of the plurality of discrete seed structures from the source substrate to the surface of the target substrate while maintaining the substantially identical orientations of the respective crystal lattices thereof.

5. The method of claim 4, wherein transferring comprises transfer printing the ones of the plurality of discrete seed structures from the source substrate to the surface of the target substrate using an elastomer stamp.

6. The method of claim 4, wherein the plurality of the discrete seed structures comprise portions of a single-crystal seed layer grown on a release layer on the source substrate, wherein the release layer comprises a material having an etching selectivity to the single-crystal seed layer.

7. The method of claim 2, wherein the selectively growing occurs laterally.

8. The method of claim 7, wherein the continuous layer is substantially monocrystalline.

9. The method of claim 8, wherein the target substrate is monocrystalline, polyvrystalline, or amorphous.

10. The method of claim 8, wherein the target substrate has a surface area of at least 100 square centimeters ($cm^2$).

11. The method of claim 10, wherein the target substrate is larger than the source substrate.

12. The method of claim 2, wherein the respective semiconductor layers are eptiaxially grown on the discrete seed structures on the target substrate without metamorphic buffers.

13. The method of claim 2, wherein crystal lattices of the respective semiconductor layers have substantially identical lattice constants and have the substantially identical orientations as those of the discrete seed structures.

14. The method of claim 13, wherein the source substrate has a different lattice constant than those of the discrete seed structures.

15. The method of claim 2, wherein a rate of growth of the respective semiconductor layers on the seed structures is greater than a rate of growth of the respective semiconductor layers on the surface of the target substrate.

16. The method of claim 15, wherein the target substrate includes a film on regions of the surface thereof between the discrete seed structures.

17. The method of claim 2, wherein the target substrate comprises silicon or an alloy thereof, aluminum or aluminum oxide, silicon dioxide, or molybdenum.

18. The method of claim 17, wherein the discrete seed structures and the respective semiconductor layers epitaxially grown thereon comprise III-V materials, group IV materials, or II-VI materials.

19. An engineered substrate, comprising: an array of discrete seed structures on a surface of a target substrate different than a source substrate on which a seed layer of the discrete seed structures was formed, the discrete seed structures comprising respective crystal lattices having substantially identical orientations wherein the target substrate has a surface area of at least 100 square centimeters ($cm^2$).

20. The substrate of claim 19, wherein neighboring ones of the discrete seed structures on the surface of the target substrate are separated by a distance of about 10 micrometers or less, which is different than a distance separating neighboring ones of the plurality of discrete seed structures on the source substrate, and wherein the orientations of the respective crystal lattices thereof are directionally aligned to each other by about 1 degree or less.

* * * * *